United States Patent [19]

Kudo

[11] Patent Number: 5,888,840
[45] Date of Patent: Mar. 30, 1999

[54] PROCESS OF GROWING MULTIPLE QUANTUM WELL STRUCTURE FOR ADJUSTING PHOTOLUMINESCENCE PEAK WAVELENGTHS TO TARGET VALUE

[75] Inventor: Koji Kudo, Tokyo, Japan

[73] Assignee: NEC Corporation, Japan

[21] Appl. No.: 869,443

[22] Filed: Jun. 5, 1997

[30] Foreign Application Priority Data

Jun. 10, 1996 [JP] Japan ................................ 8-147298

[51] Int. Cl.[6] .................................................. H01L 21/00
[52] U.S. Cl. .............................................. 438/31; 438/39
[58] Field of Search ................................ 438/31, 32, 39

[56] References Cited

U.S. PATENT DOCUMENTS

| 4,702,781 | 10/1987 | Sasai et al. ................................ 437/129 |
| 5,173,336 | 12/1992 | Kennedy ................................ 427/248.1 |
| 5,574,289 | 11/1996 | Aoki et al. ................................ 257/17 |
| 5,580,818 | 12/1996 | Sakata ................................ 437/129 |

FOREIGN PATENT DOCUMENTS

| 0476689 | 9/1991 | European Pat. Off. .......... H01S 3/19 |
| 0551759 | 12/1992 | European Pat. Off. ......... H01L 33/00 |
| 0661783 | 12/1994 | European Pat. Off. .......... H01S 3/19 |
| 0680119 | 4/1995 | European Pat. Off. ........ H01S 3/025 |
| 8078340 | 3/1996 | Japan ........................ H01L 21/3065 |
| 9322793 | 11/1993 | WIPO .......................... H01L 21/205 |

OTHER PUBLICATIONS

"Low Threshold and High Uniformity for Novel 1.3–μm–Strained InGaAsP MQW DC–PBH LD's Fabricated by the All–Aelective MOVPE Technique"; Sakata et al; IEEE; vol. 9; No. 3; Mar. 1997; pp. 291–293.

"Selective metalorganic vapor phase epitaxial growth of InGaAsP/InP layers with bandgap energy control in InGaAs/ InGaAsP multiple–quantum well structures" Sasaki et al; Journal of Crystal Growth; 132; (1993) Sep. II, Nos. 3/4, pp. 435–443.

"InGaAs/InGaAsP MQW Electroabsorption Modulator Integrated with a DFB Laser Fabricated by Band–Gap Energy Control Selective Area MOCVD"; Aoki et al; IEEE Journal of Quantum Electronics; vol. 29; No. 6; Jun. 1993; pp. 2088–2096.

"1.24–1.66 μm quantum energy tuning for simultaneously grown InGaAs/InP quantum wells by selective–area metalorganic vapor pahse epitaxy"; Suzuki et al; Journal of Crystal Growth; 145; 1994; pp. 249–255.

*Primary Examiner*—Brian Dutton
*Attorney, Agent, or Firm*—Hayes, Soloway, Hennessey, Grossman & Hage, P.C.

[57] ABSTRACT

While compound semiconductor materials are being selectively grown on an open stripe area of a compound semiconductor substrate for forming a multiple quantum well structure, one of the depositing time and the gas flow rate is gradually decreased from the bottom of the multiple quantum well structure toward the top thereof; although the top surface area of the multiple quantum well structure is decreased from the bottom toward the top, the component layers of the multiple quantum well structure are regulated to a target thickness, and the half band width of photoluminescence spectrum is improved.

25 Claims, 12 Drawing Sheets

PROCESS OF GROWING MULTIPLE QUANTUM WELL STRUCTURE FOR ADJUSTING PHOTOLUMINESCENCE PEAK WAVELENGTHS TO TARGET VALUE

FIELD OF THE INVENTION

This invention relates to a process of fabricating a semiconductor photo device and, more particularly, to a process of growing a multiple quantum well structure for adjusting photoluminescence peak wavelengths of the quantum wells to a target value.

DESCRIPTION OF THE RELATED ART

A metalorganic vapor phase epitaxy is attractive technology in the fabrication of semiconductor photonic devices. The metalorganic vapor phase epitaxy is combined with a lithography, and selectively grows a semiconductor layer of a predetermined composition on a substrate. An open stripe region is defined in an insulating mask, and a semiconductor ridge is grown on the open stripe region through the metalorganic vapor phase epitaxy. The composition of the semiconductor ridge and the thickness of each composition layer are controllable.

FIG. 1 illustrates a typical example of the insulating mask 1 patterned on an n-type indium-phosphide substrate 2. The insulating mask 1 is hatched so as to clearly discriminate it from the p-type indium-phosphide substrate 2. A stripe-shaped opening 4a is defined between the mask stripes 1a and 1b, and is 1.5 microns wide. An open stripe region 2a is exposed to the stripe-shaped opening 1a. Quaternary semiconductor material such as indium-gallium arsenide and indium-gallium-arsenic phosphide is grown on the open stripe region 2a by using the metalorganic vapor phase epitaxy, and a multiple quantum well ridge structure is fabricated over the open stripe region 2a. Light is radiated from the multiple quantum well ridge structure, and the wavelength and the thickness of the epitaxial layers are changeable by varying the mask stripe width. For this reason, a semiconductor laser emitting element, an optical modulator and an optical amplifier can be integrated on a single substrate by using the insulating mask 1. This aspect is taught by Sasaki et. al. in "Selective metalorganic vapor phase epitaxial growth of InGaAsP/InP layers with bandgap energy control in InGaAs/InGaAsP multiple-quantum well structures", Journal of Crystal Growth 132, pages 435 to 443, 1993.

In the selective growth, when the mask stripe width is changed, a bandgap energy shift takes place in the multiple-quantum well. The wavelength of radiated light is increased together with the mask stripe width. Assuming now that a multiple quantum well ridge structure 3 is grown on an open stripe region 2a exposed between the mask stripes 1a and 1b, and the mask stripes 1a/1b has wide mask strip areas 1d and narrow mask stripe areas 1e (see FIG. 1). The multiple quantum well ridge structure 3 has a multiple quantum well 3a sandwiched between light confining layers 3b and 3c, and the upper light confining layer 3c is overlain by a clad layer 3d. The wide mask stripe areas 1d cause the multiple quantum well 3a to have the energy bandgap equivalent to the wavelength of 1.55 microns, and the narrow mask strip areas 1e causes the multiple quantum well 3a to have the energy bandgap equivalent to the wavelength of 1.48 microns. The multiple quantum well 3a for 1.55 micron wavelength is available for a laser emitting element, and the multiple quantum well 3a for 1.48 micron wavelength serves as an optical modulator. Thus, the laser emitting element and the optical modulator are concurrently grown on the open stripe region 2a by changing the mask stripe width.

However, a problem is encountered in the prior art selectively growing process in that the laser emitting element tends to shift the quantum well bandgap wavelength toward the long wave side. This is because of the fact that the compound semiconductor layers of the multiple quantum well are increased in thickness toward the upper layer. For this reason, the photoluminescence peak wavelengths of the quantum wells are different from one another, and it is impossible to sufficiently make the half band width of the photoluminescence spectrum narrow. This results in a small gain of the active layers of the laser emitting element in terms of unit injection current. Even if an optimum optical resonator is incorporated in the prior art photonic integrated device for the laser light, the laser emitting element can not sufficiently display the ability.

SUMMARY OF THE INVENTION

It is therefore an important object of the present invention to provide a process of fabricating a multiple quantum well structure for adjusting the photoluminescence peak wavelengths of the quantum wells to a target value.

The present inventor firstly investigated the relation between a growing rate and a distance from a substrate. The present inventor prepared two indium phosphide substrates, and an open stripe region of 1.5 micron wide was defined in the major surface of one of the indium phosphide substrates by using an insulating mask. Indium gallium arsenic phosphide was grown on the major surface of the other indium phosphide substrate uncovered with an insulating mask, and determined a reference growing rate d0. The composition of the indium gallium arsenic phosphide was corresponding to the wavelength of 1.46 microns. The gas flow rate was constantly supplied to a reaction chamber of a metalorganic vapor phase epitaxial growing system. The growing temperature was 635 degrees in centigrade, and the pressure was regulated to 150 torr. Thereafter, the indium gallium arsenic phosphide was grown on the open stripe region under the same growing conditions, and determined a growing rate d. The present inventor calculated the rate of the growing rate d to the reference rate d0, and the rate was plotted as shown in FIG. 3. The plots PL1 taught that the ratio d/d0 was linearly increased together with the distance from the indium phosphide substrate.

A seven-layer multiple quantum well structure was assumed to be grown on the open stripe region. The first quantum well had a well layer of 7 nanometers thick and a barrier layer of 12 nanometers thick, and was positioned at 0.2 micron from the indium phosphide substrate. If each well layer was grown for certain time period, the top well layer was increased in thickness at 14 percent rather than the bottom well layer.

The present inventor noticed that the indium gallium arsenic phosphide layer gradually decreased the area of the top surface, and the cross section was like a trapezoid. The present inventor thought that the top surface gradually decreased made the growing rate larger under the constant gas flow rate. In other words, although the amount of indium gallium arsenic phosphide was constant per unit time, the area was decreased, then the growing rate was increased.

The present inventor concluded that if the amount of semiconductor material to be deposited per unit area was kept constant, all of the quantum well layers would be regulated to a target thickness.

To accomplish the object, the present invention proposes to control at least one of the parameters of an epitaxial growth affected to the amount of semiconductor material to be deposited per unit area.

In accordance with the present invention, there is provided a process of fabricating a multiple compound semiconductor structure changing the area of a surface during a growth of compound semiconductor, comprising the steps of: a) preparing a substrate; b) forming a mask defining an open area of said substrate; and c) epitaxially growing the compound semiconductor on said open area by changing at least one parameter of the growth so as to control the amount of the compound semiconductor to be grown per unit area of the surface.

The parameter may be a gas flow rate or a depositing time.

BRIEF DESCRIPTION OF THE DRAWINGS

The features and advantages of the process according to the present invention will be more clearly understood from the following description taken in conjunction with the accompanying drawings in which.

DESCRIPTION OF THE PREFERRED EMBODIMENTS

The depositing time is the first example of the parameter to be controlled for regulating the amount of compound semiconductor material deposited on unit area. FIGS. 4A to 4D illustrate a process of fabricating a semiconductor photonic device embodying the present invention. The semiconductor photonic device has a multiple quantum well ridge structure, and seven quantum wells are incorporated in the multiple quantum well ridge structure.

Figure 1:
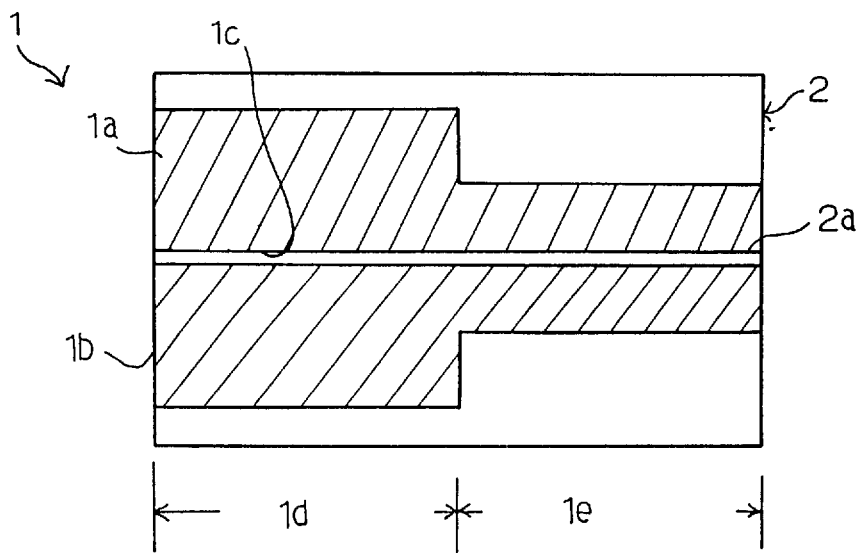
FIG. 1 is a plan view showing the layout of the prior art insulating mask patterned on the compound semiconductor substrate.
Figure 2:
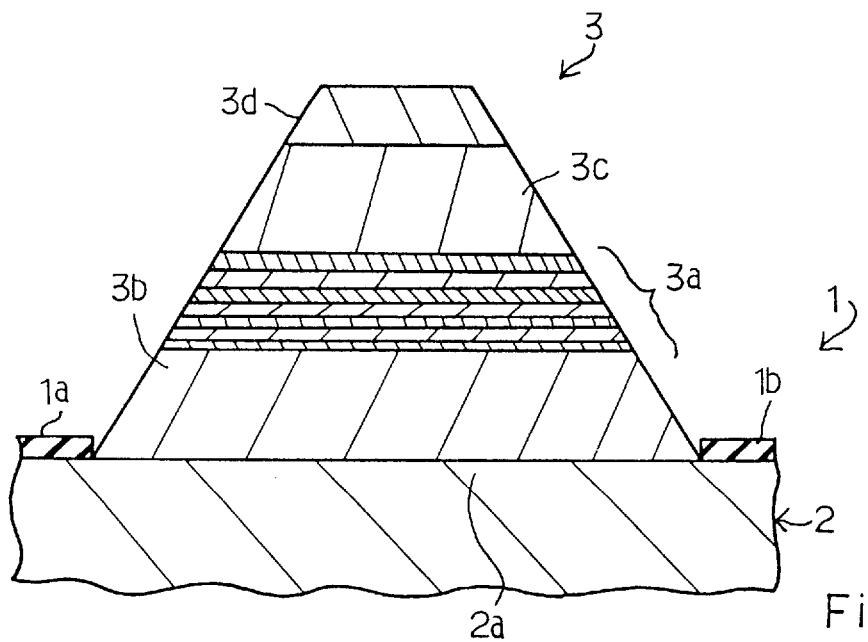
FIG. 2 is a cross sectional view showing the structure of the prior art multiple quantum well ridge structure.
Figure 3:
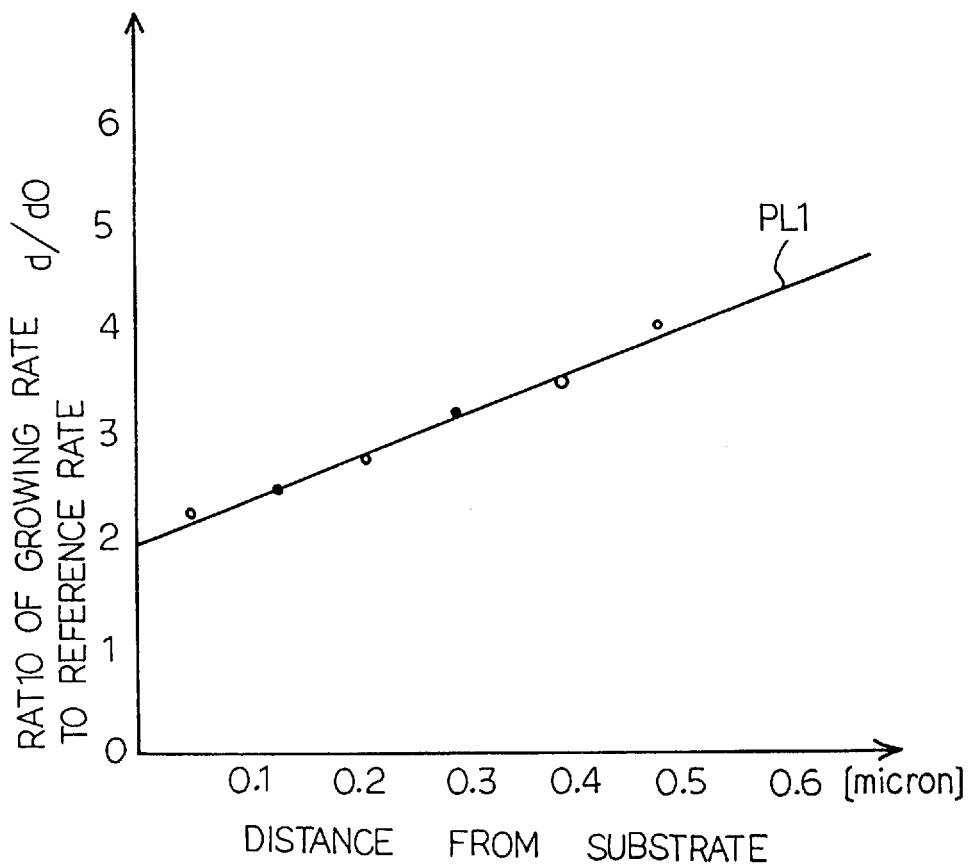
FIG. 3 is a graph showing the relation between the ratio of growing rate to reference rate and the distance from the substrate.
Figure 4A:
FIGS. 4A to 4D are cross sectional views showing a process of fabricating a semiconductor photonic device according to the present invention.
Figure 4B:
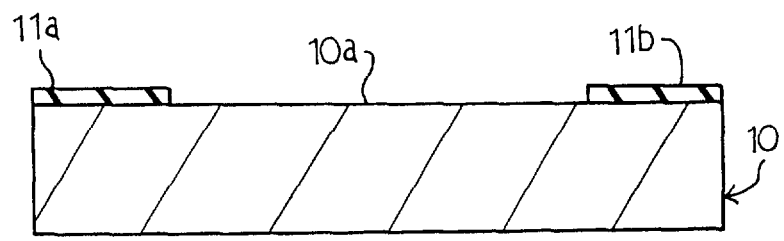

The process starts with preparation of an indium phosphide substrate 10 as shown in FIG. 4A. Silicon oxide is deposited on the major surface of the indium phosphide substrate 10, and the silicon oxide layer is patterned into a pair of mask stripes 11a/11b, and the mask stripes 11a/11b are spaced apart from each other by 1.5 micron so as to define an open stripe area 10a as shown in FIG. 4B.

Subsequently, the indium phosphide substrate 10 is placed on a turn table 12a in a reaction chamber 12b of a metalorganic vapor phase epitaxial growing system 12, and a heater 12c heats the reaction chamber around the indium phosphide chamber 12b at a certain temperature for pyrolysis. Gaseous mixture is introduced into the reaction chamber 12b, and a quantum well layer and a barrier layer are alternately grown on the open strip area 10a. In this instance, both of the quantum well layer and the barrier layer are formed of indium gallium arsenic phosphide. The composition of the indium gallium arsenic phosphide for the quantum wells is corresponding to the wavelength of 1.46 microns, and the compression strain is 1.0 percent. On the other hand, the composition of the indium gallium arsenic phosphide for the barrier layers is corresponding to the wavelength of 1.25 microns.

Figure 4C:
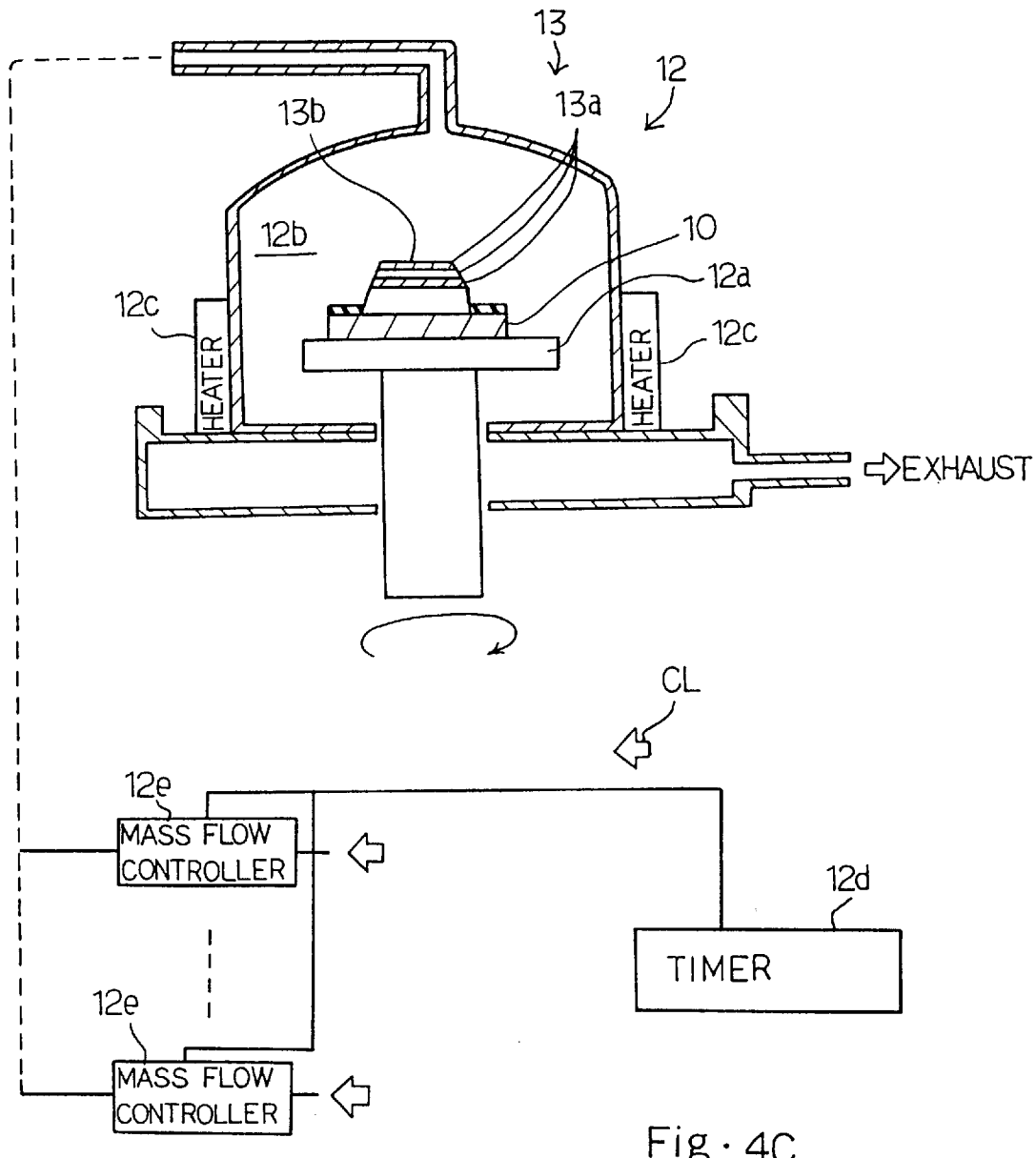

Each pair of the quantum well layer and the barrier layer is designated by reference numeral 13a, and the three pairs form in combination a multi-layered compound semiconductor structure 13 in the stage shown in FIG. 4C. The top surface of the multi-layered compound semiconductor structure 13 is designated by reference 13b.

Figure 4D:
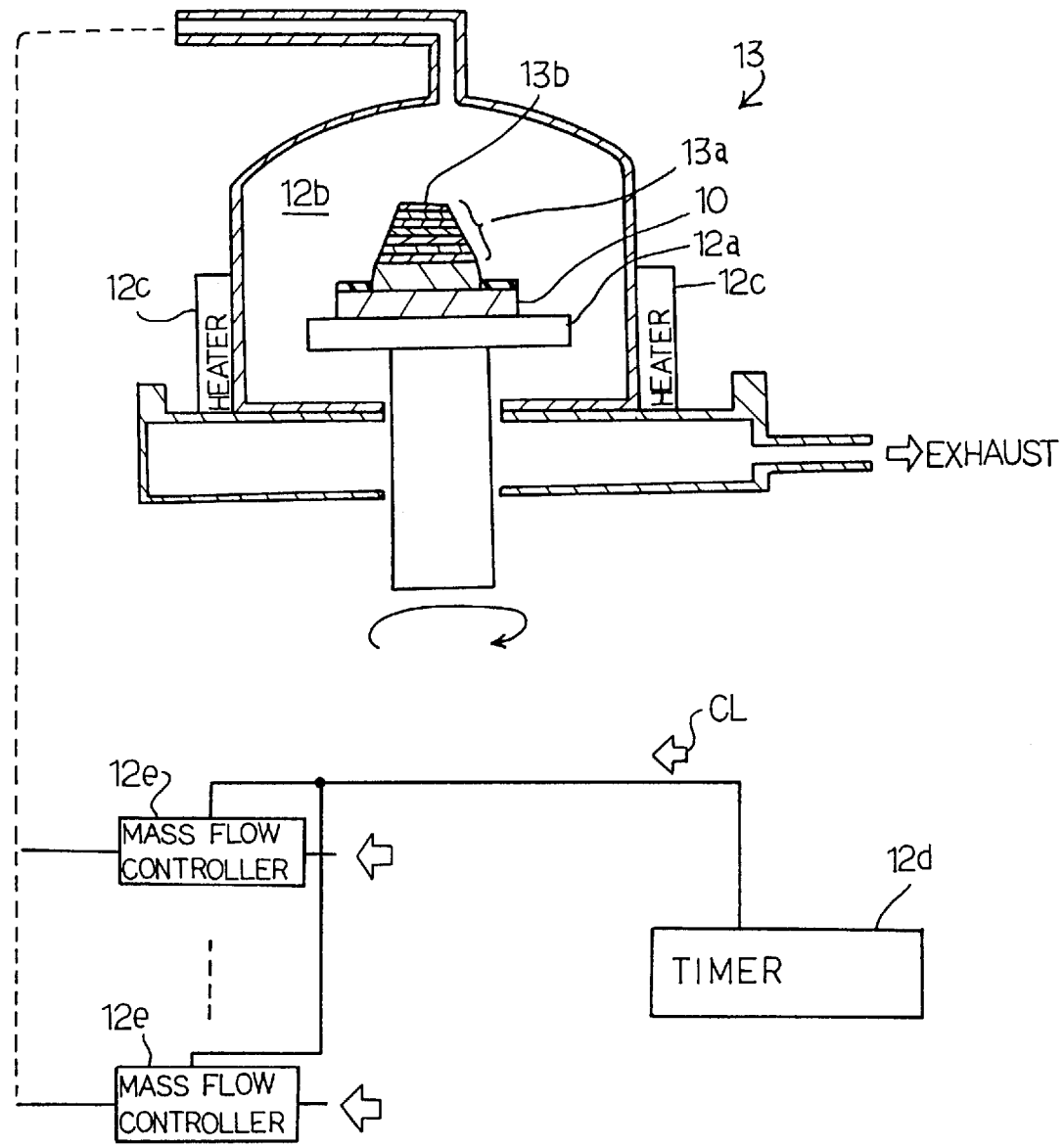

The pair of quantum well layer and barrier layer is further laminated on the multi-layered compound semiconductor structure 13, and the top surface 13b of the multi-layered compound semiconductor structure 13 is gradually decreased in area as shown in FIG. 4D. The multi-layered compound semiconductor structure 13 finally has seven pairs.

While the quantum well layers and the barrier layers are being alternated over the open stripe area 10a, a timer 12d supplies a control signal CL to mass flow controllers 12e, and controls time period for the quantum well layers and the barrier layers. The depositing time is summarized in Table 1. The quantum well layers and the barrier layers are numbered "1" to "7" from the bottom toward the top.

TABLE 1

| Quantum | Growing time (second) | |
|---|---|---|
| Well | Well layer | Barrier layer |
| 7 | 20.3 | 45.2 |
| 6 | 20.9 | 46.5 |
| 5 | 21.4 | 47.7 |
| 4 | 22.0 | 49.0 |
| 3 | 22.6 | 50.3 |
| 2 | 23.1 | 51.5 |
| 1 | 23.7 | 52.8 |

The quantum wells are regulated to a target thickness by virtue of the time control. This is because of the fact that the time control maintains the amount of compound semiconductor deposited on unit area constant regardless of the area of the top surface 13b.

Upon completion of the deposition, the multi-layered compound semiconductor structure 13 forms an essential part of the multiple quantum well ridge structure. The indium phosphide substrate 10 is taken out from the reaction chamber 12b, and an electrode (not shown) is deposited on the reverse surface of the indium phosphide substrate 10.

The gas flow rate is the second example of the parameter to be controlled for regulating the amount of compound semiconductor deposited on unit area. FIGS. 5A to 5D illustrate another process of fabricating a semiconductor photonic device embodying the present invention. The semiconductor photonic device also has a multiple quantum well ridge structure, and seven quantum wells are incorporated in the multiple quantum well ridge structure as similar to that of the above described semiconductor photonic device.

Figure 5A:
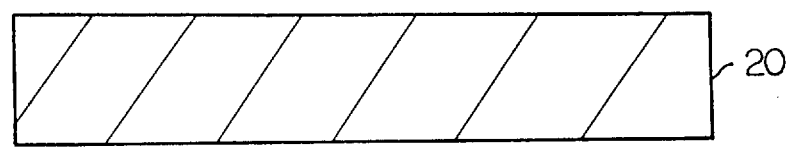
FIGS. 5A to 5D are cross sectional views showing another process of fabricating a semiconductor photonic device according to the present invention.
Figure 5B:
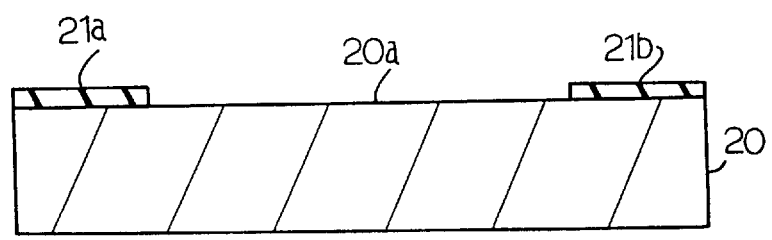

The process starts with preparation of an indium phosphide substrate 20 as shown in FIG. 5A. Silicon oxide is deposited on the major surface of the indium phosphide substrate 20, and the silicon oxide layer is patterned into a pair of mask stripes 21a/21b, and the mask stripes 21a/21b are spaced apart from each other by 1.5 micron so as to define an open stripe area 20a as shown in FIG. 5B.

Subsequently, the indium phosphide substrate 20 is placed on a turn table 22a in a reaction chamber 22b of a metalorganic vapor phase epitaxial growing system 22, and a heater 22c heats the turn table 22b around the indium phosphide chamber 22b at a certain temperature for pyrolysis. Gaseous mixture is introduced into the reaction chamber 22b, and a quantum well layer and a barrier layer are alternately grown on the open strip area 20a. In this instance, both of the quantum well layer and the barrier layer are formed of indium gallium arsenic phosphide. The composition of the indium gallium arsenic phosphide for the quantum wells is corresponding to the wavelength of 1.46 microns, and the compression strain is 1.0 percent. On the other hand, the composition of the indium gallium arsenic phosphide for the barrier layers is corresponding to the wavelength of 1.25 microns.

Figure 5C:
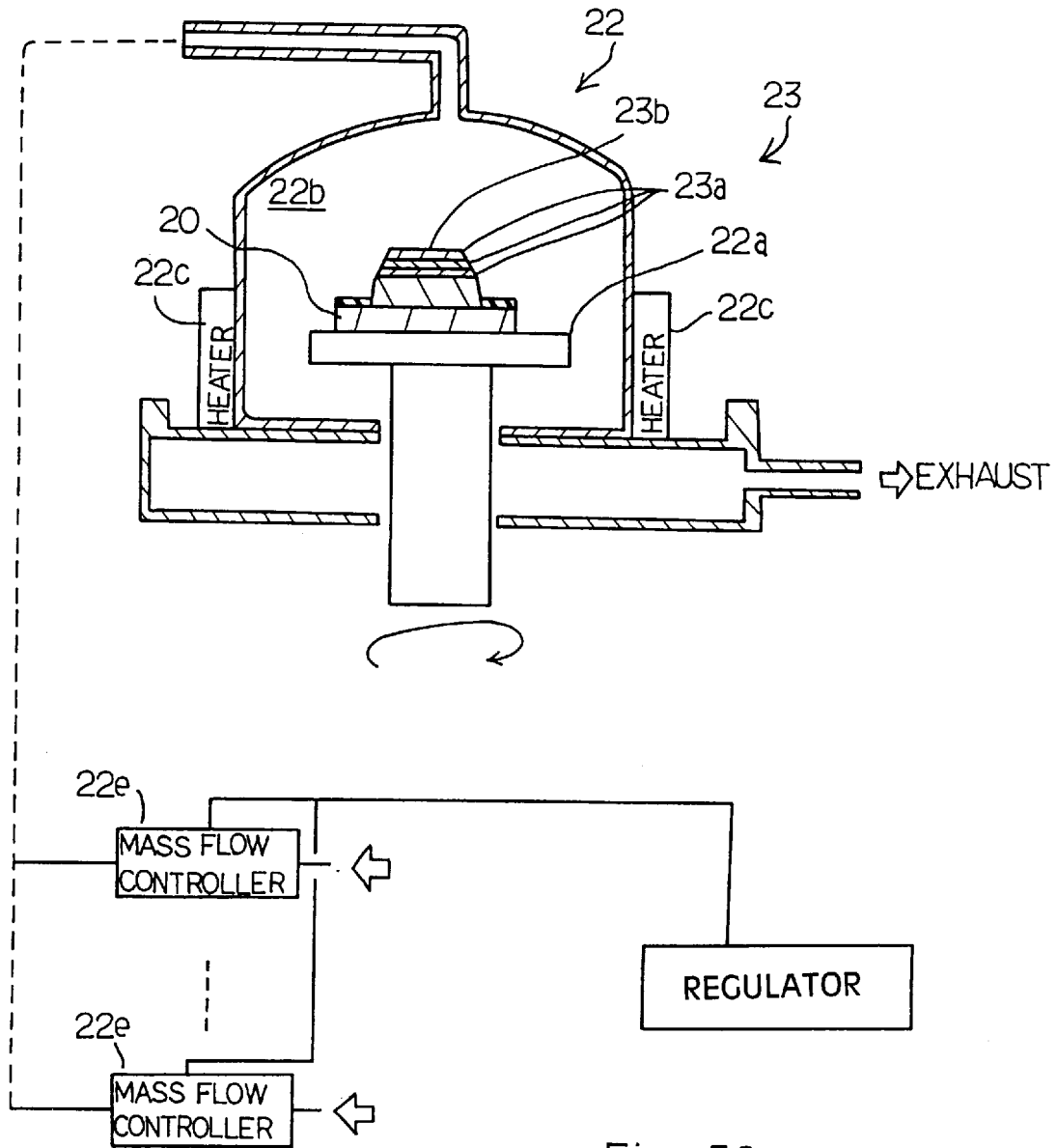

Each pair of the quantum well layer and the barrier layer is designated by reference numeral 23a, and the three pairs form in combination a multi-layered compound semiconductor structure 23 in the stage shown in FIG. 5C. The top surface of the multi-layered compound semiconductor structure 13 is designated by reference 23b.

Figure 5D:
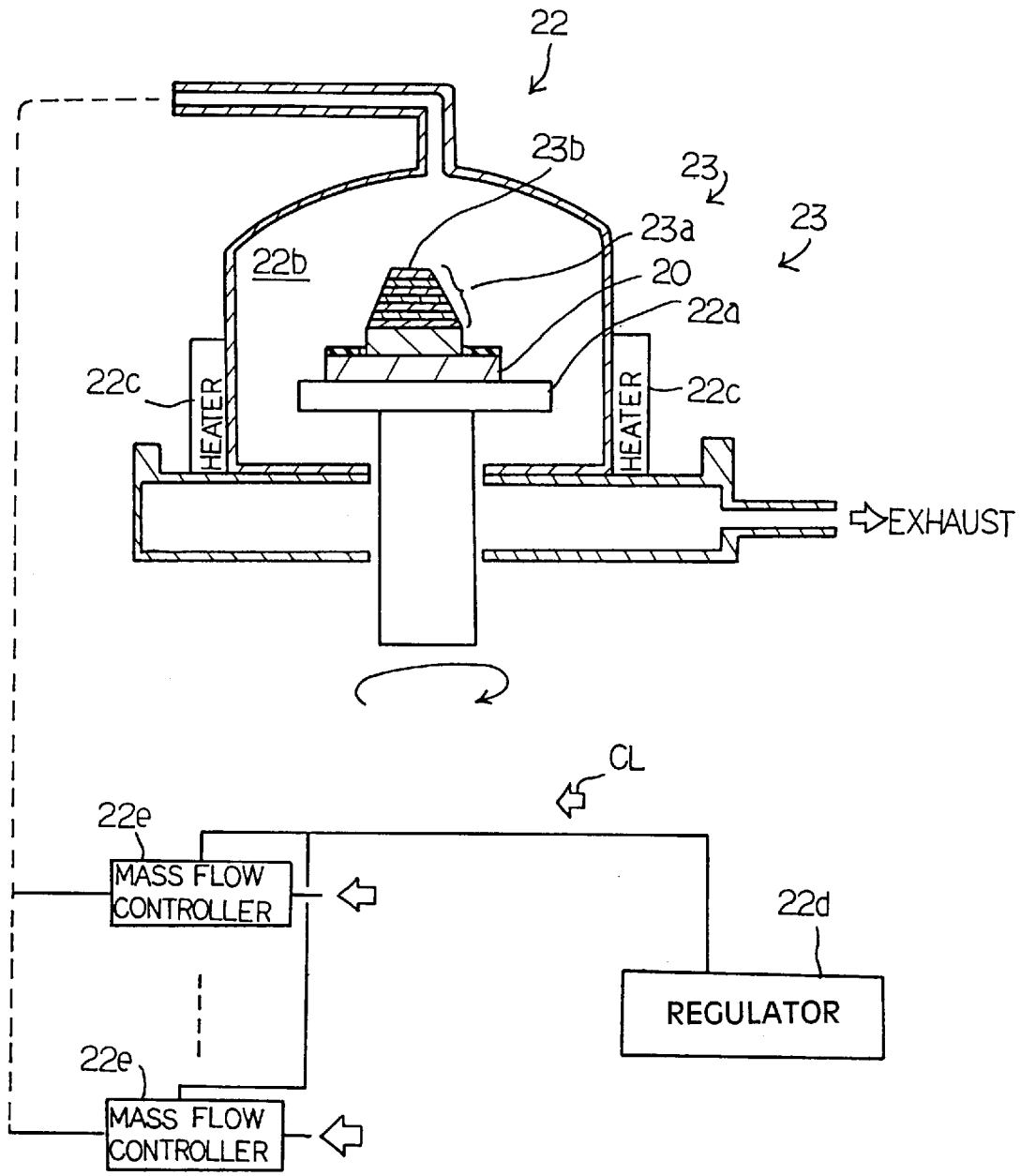

The pair of quantum well layer and barrier layer is further laminated on the multi-layered compound semiconductor structure 23, and the top surface 23b of the multi-layered compound semiconductor structure 23 is gradually decreased in area as shown in FIG. 5D. The multi-layered compound semiconductor structure 23 finally has seven pairs.

While the quantum well layers and the barrier layers are being alternated over the open stripe area 20a, a regulator 22d supplies a control signal CL to mass flow controllers 22e, and controls gas flow rates component gases for the quantum well layers and the barrier layers. The depositing time is summarized in Table 2. The quantum well layers and the barrier layers are numbered "1" to "7" from the bottom toward the top.

TABLE 2

| Quantum | Gas flow rate (sccm) | |
|---|---|---|
| Well | Well layer | Barrier layer |
| 7 | 46.5 | 37.2 |
| 6 | 47.7 | 38.1 |
| 5 | 48.9 | 39.1 |
| 4 | 50.0 | 40.0 |
| 3 | 51.2 | 40.9 |
| 2 | 52.3 | 41.8 |
| 1 | 53.5 | 42.8 |

The quantum wells are regulated to a target thickness by virtue of the flow rate control. This is because of the fact that the flow rate control maintains the amount of compound semiconductor deposited on unit area constant.

Upon completion of the deposition, the multi-layered compound semiconductor structure 23 forms an essential part of the multiple quantum well ridge structure. The indium phosphide substrate 20 is taken out from the reaction chamber 22b, and a cladding layer is formed thereon. Electrodes (not shown) are deposited on the cladding layer and the reverse surface of the indium phosphide substrate 20.

The present inventor evaluated the two multiple quantum well structures fabricated through the processes described hereinbefore. For comparison use, the present inventor further fabricated a third multiple quantum well structure without any modulation of deposition time and any modulation of gas flow rate.

Figure 6:
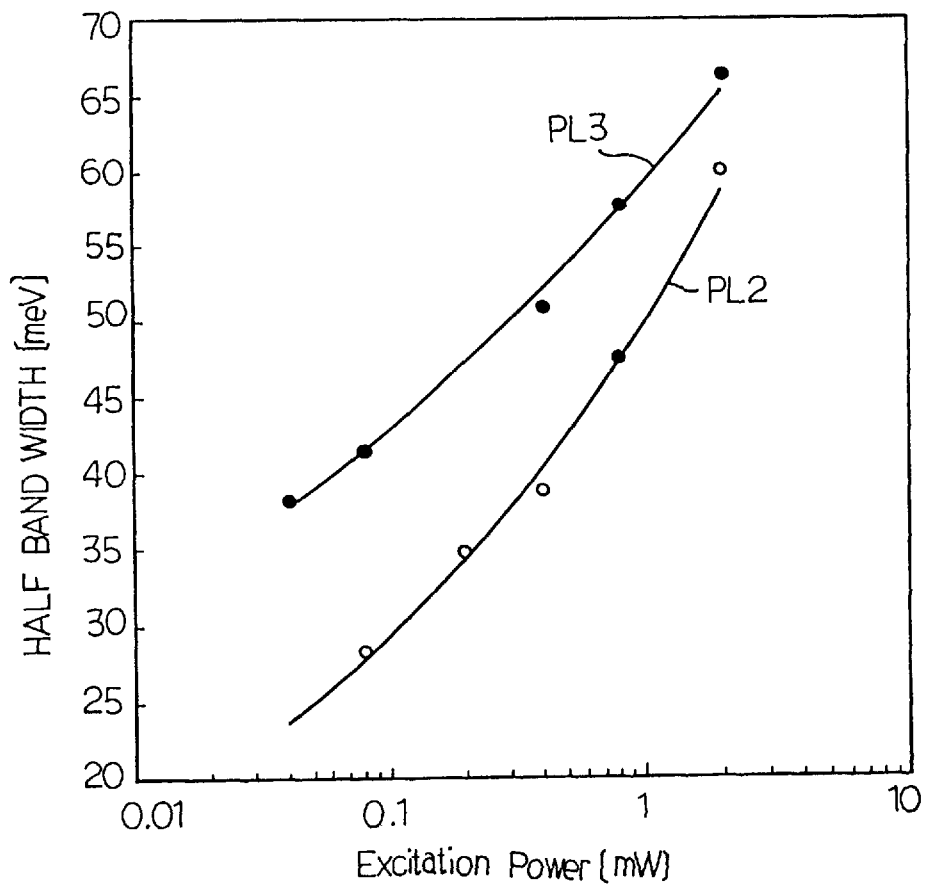
FIG. 6 is a graph showing the relation between the half band width of photoluminescence spectrum of a multiple-quantum well and the excitation power.

The present inventor measured th e half band width of photoluminescence spectrum for each multiple quantum well structure in terms of excitation power, and plotted the half band width as shown in FIG. 6. Plots PL2 were indicative of the half band width of the first and second multiple quantum well structures, and plots PL3 stood for the half band width of the third multiple quantum well structure without any modulation. Comparing plots PL2 with plots PL3, it was understood that the first and second multiple quantum well structures achieved the excitation power at half band width 10 meV narrower than that of the third multiple quantum well structure.

The present inventor fabricated several examples of the semiconductor photonic device as follows.

FIRST EXAMPLE

Figure 7:
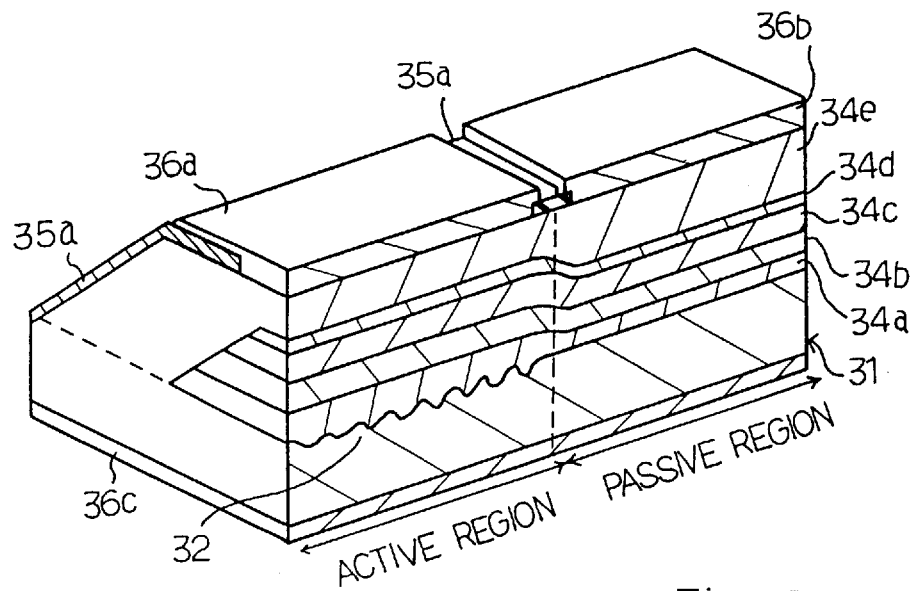
FIG. 7 is a perspective view showing an example of a semiconductor photonic integrated circuit device fabricated through the process according to the present invention.

The first example was a semiconductor photonic integrated circuit device containing a distributed feedback laser emitting element and an optical modulator, and FIG. 7 illustrates the semiconductor photonic integrated circuit device.

The semiconductor photonic integrated circuit device was fabricated through the process where the depositing time was controlled. Firstly, an n-type indium phosphide substrate 31 was prepared, and a diffraction grating 32 of 30 nanometers deep was formed in an active region of the n-type indium phosphide substrate 31 by using an interference exposing technique.

Figure 8:
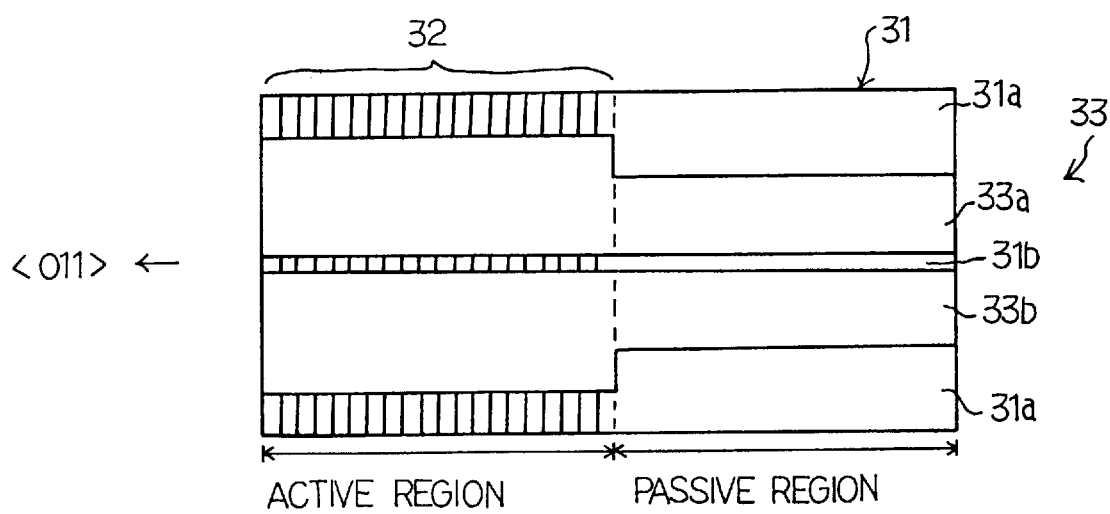
FIG. 8 is a plan view showing a pair of mask stripes used for the semiconductor photonic integrated circuit device.

Subsequently, a silicon oxide mask 33 was patterned on a major surface 31a of the n-type indium phosphide substrate 31 as shown in FIG. 8. The silicon oxide mask 33 extended in <011> direction, and a pair of mask stripes 33a/33b defined an open stripe area 31b in the major surface 31a. The open stripe area 31b was as narrow as 1.5 microns. The mask stripes 33a/33b were wide over the active region and narrow over a passive region of the n-type indium phosphide substrate 33. The wide portions of the mask stripes 33a/33b were 30 microns wide and the narrow portions were 20 microns wide.

Subsequently, the n-type indium phosphide substrate 31 partially covered with the silicon oxide mask 33 was placed in the reaction chamber 12b of the metalorganic vapor phase epitaxial growing system 12 (see FIG. 4C). Firstly, gaseous mixture containing trimethylindium, triethylgallium, AsH$_3$ and PH$_3$ was pyrolyzed at 365 degrees in centigrade under the pressure of 150 torr, and a photo-confining layer 34a of n-type indium gallium arsenic phosphide was formed on the open stripe area 31b. The composition of the n-type indium gallium arsenic phosphide was corresponding to the wavelength of 1.2 microns over the active region.

Subsequently, quantum well layers and barrier layers alternately grown, and the depositing time was controlled as described hereinbefore. The quantum well layers and the barrier layers were formed of indium gallium arsenic phosphide, and the compositions were similar to those described in conjunction with FIGS. 4A to 4D. In this instance, gaseous mixture containing trimethylindium, triethylgallium, AsH$_3$ and PH$_3$ was pyrolyzed at 365 degrees in centigrade, and the pressure was regulated to 150 torr.

Gaseous mixture containing trimethylindium, triethylgallium, AsH$_3$ and PH$_3$ was pyrolyzed at 365 degrees in centigrade under pressure of 150 torr, and, thereafter, gaseous mixture containing trimethylindium, triethylgallium, AsH$_3$ and PH$_3$ was pyrolyzed at 365 degrees in centigrade under pressure of 150 torr. Then, a photo confining layer 34c of intrinsic indium gallium arsenic phosphide, a cladding layer 34d of p-type indium phosphide were successively grown. The peak wavelength of photoluminescence spectrum of the multiple quantum well structure was designed at 1.55 microns over the active region and at 1.48 microns over the passive region.

Using the photo-lithography, the open stripe area 31b was increased to 6 microns wide, and the mask width was regulated to 4 microns. Using the silicon oxide mask, gaseous mixture containing trimethylindium, triethylgallium, AsH$_3$ and PH$_3$ was pyrolyzed at 365 degrees in centigrade under pressure of 150 torr, and a burying layer 34e of 2 microns thick was grown.

Subsequently, a silicon oxide layer 35a is formed over the burying layer 34e, and windows were formed for current injection. Upper electrodes 36a/36b and a lower electrode 36c were formed by using a sputtering.

The distributed feedback laser emitting element was 300 microns long, and the optical modulator was also 250 microns long. The distributed feedback laser emitting element and the optical modulator formed parts of an integrated light emitting source. A comparative example was further fabricated through the prior art process the growing conditions of which were identical with those of the process of the present invention except for the depositing time control. The integrated light emitting source achieved an oscillating threshold current decreased to a half of that of the prior art and an efficiency 1.5 times larger than that of the prior art. Although the light output of the prior art was saturated at 20 milliwatt at 25 degrees in centigrade. However, the light output of the integrated light emitting source was not saturated until 30 milliwatt.

SECOND EXAMPLE

Figure 9:
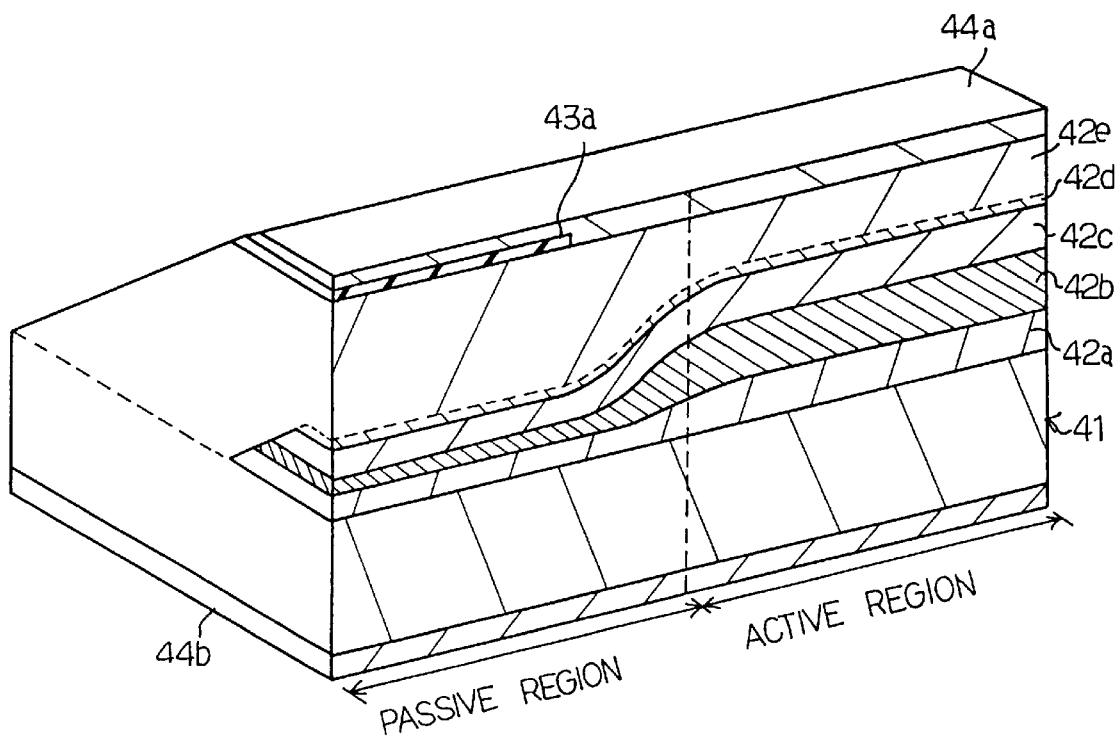
FIG. 9 is a perspective view showing another example of a semiconductor photonic integrated circuit device fabricated through the process according to the present invention.

FIG. 9 illustrates the second example of the semiconductor photonic integrated circuit device. the semiconductor photonic integrated circuit device contains a laser emitting element and a spot size converter.

Figure 10:
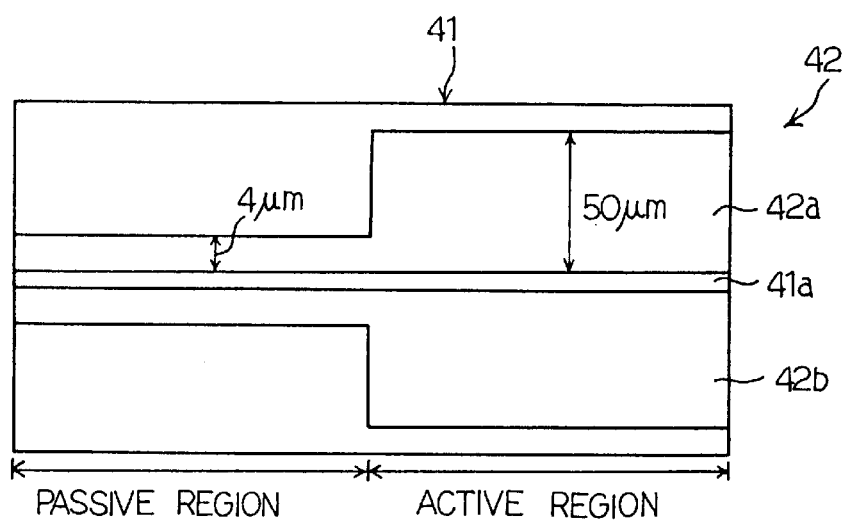
FIG. 10 is a plan view showing a pair of mask stripes used for the semiconductor photonic integrated circuit device.

The second example was fabricated as follows. On an n-type indium-phosphide substrate 41 was patterned a silicon oxide mask 42 which had a pair of mask stripes 42a and 42b spaced apart from each other by 1.5 microns for defining an open stripe area 41a as shown in FIG. 10. The mask stripes 42a/42b had wide portions over an active region and narrow portions over a passive region. The wide portions were as wide as 50 microns, and the narrow portions were as narrow as 4 microns.

An n-type indium gallium arsenic phosphide photo-confining layer 42a was grown on the open stripe area 41a, and the composition was corresponding to the wavelength of 1.12 microns over the active region. A multiple quantum well structure 42b was formed on the photo-confining layer 42a, and indium gallium arsenic phosphide well layers and indium gallium arsenic phosphide barrier layers were alternated with one another so as to form seven quantum wells. The multiple quantum well structure 42b was hatched in FIG. 9 for easily discriminating it from other layers. The multiple quantum well structure 42b was grown by using the metalorganic vapor phase epitaxy, and the depositing time was controlled as described in conjunction with FIGS. 4A to 4D.

Subsequently, intrinsic indium gallium arsenic phosphide photo-confining layer 42c and a p-type indium phosphide cladding layer 42d were successively grown. The peak wavelength of photoluminescence spectrum was regulated to 1.3 microns over the active region and 1.10 microns over the passive region.

Using the photo-lithography, the open stripe region 41a was widened to 6 microns, and the mask width was changed to 2 micron over the entire region. Thereafter, a p-type indium phosphide burying layer 42e was grown to 2 micron thick.

A silicon oxide layer 43a was formed on the p-type indium phosphide burying layer 42e, and a window was formed in the silicon oxide layer 43a so as to allow current to be injected. An upper electrode 44a and a lower electrode 44b were formed on the burying layer 4e and the reverse surface of the substrate 41 by using a sputtering.

The optical waveguide over the passive region was decreased in thickness toward the output end, and served as a spot side converter. In this instance, the active region was 200 microns long, and the spot size converter was 100 nanometers long. A comparative example was further fabricated through the prior art process. The second example decreased an oscillation threshold current to a half of that of the comparative example, and achieved an efficiency 1.3 times larger than that of the comparative example.

The second example and the comparative example were coated with low reflective films at the front ends and high reflective films at the rear ends. The light radiated from one end of the comparative example was saturated at 60 milliwatt at 25 degrees in centigrade. On the other hand, the second example was not saturated until 100 milliwatt.

THIRD EXAMPLE

Figure 11:
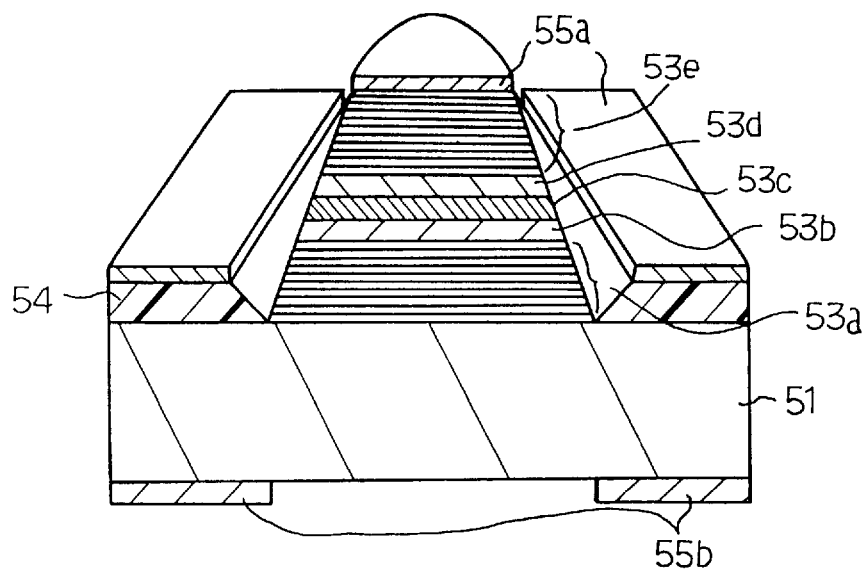
FIG. 11 is a perspective view showing yet another example of a semiconductor photonic integrated circuit device fabricated through the process according to the present invention.

FIG. 11 illustrates a third example of the semiconductor photonic integrated circuit device. A surface light emitting laser element is incorporated in the third example.

Figure 12:
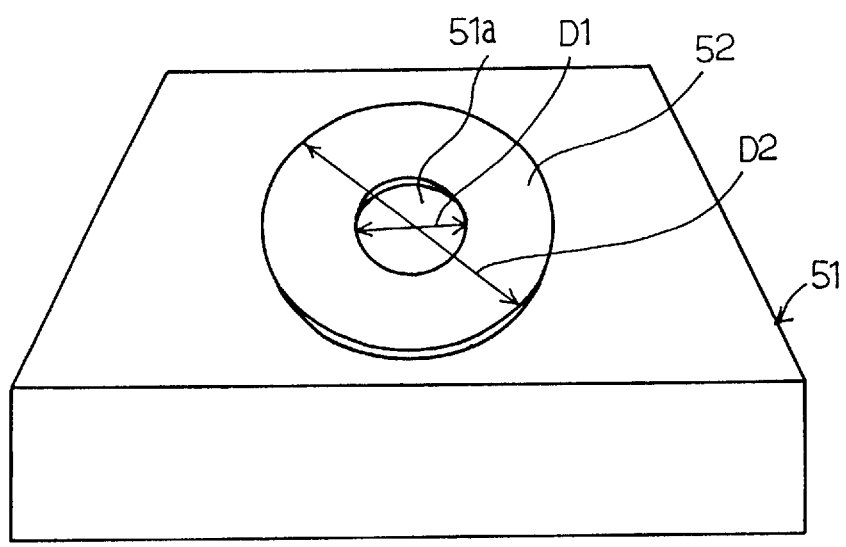
FIG. 12 is a perspective view showing a mask used for the semiconductor photonic integrated circuit device.

The third example was fabricated as follows. Firstly, on the major surface of an n-type gallium arsenide substrate 51 was patterned a silicon oxide mask 52 which was shaped into a ring configuration as shown in FIG. 12. The inner radius of curvature D1 was 5 microns, and the outer diameter D2 was 20 microns. An open area 51a was exposed to the circular opening defined by the silicon oxide mask 52.

A distributed Bragg-reflection structure 53a of n-type aluminum arsenide and gallium arsenide was formed on the open area 51a of the substrate 51, and a gallium arsenic photo-confining layer 53b of 240 nanometers thick was grown on the distributed Bragg-reflection structure 53a. A multiple quantum well structure 53c of indium gallium arsenide and gallium arsenide was grown on the photo-confining layer 53b. The multiple quantum well structure 53c had three quantum wells, and the indium gallium arsenide layer and the gallium arsenide layer were 8 nanometers thick and 12 nanometers thick, respectively. A gallium arsenide photo-confining layer 53d of 240 nanometers thick was grown on the multiple quantum well structure 53c, and a distributed Bragg-reflection structure 53e of p-type aluminum arsenide and gallium arsenide was formed on the photo-confining structure 5d. The growth rates of gallium arsenide, aluminum arsenide and so fourth in the vertical direction were taken into account, and the deposition time was controlled in accordance with the present invention. For this reason, the period of the distributed Bragg-reflection structure 53a, the thicknesses of the quantum well layers and the period of the distributed Bragg-reflection structure 53e were adjusted to target values, respectively.

Subsequently, the resultant compound semiconductor structure was embedded in a polyimide layer 54a, and an upper electrode 55a and a lower electrode 55b were formed by using a sputtering after forming a window for current injection. The surface light emitting laser element had the resonator length of 5 micron.

A comparative example was fabricated as similar to the third example except for the deposition time control. The third example decreased the oscillation threshold current to a quarter of that of the comparative example, and the efficiency was 1.5 times larger than that of the comparative example.

Although particular embodiments of the present invention have been shown and described, it will be obvious to those skilled in the art that various changes and modifications may be made without departing from the spirit and scope of the present invention.

For example, another compound semiconductor system such as InGaAsN/GaAs is available for the process according to the present invention. The metalorganic vapor phase epitaxy according to the present invention is applicable to any multiple quantum well structure having more than one quantum well, and the open stripe area and the open circular area are never limited to 1.5 microns wide and 5 micron in diameter. However, when the open stripe area and the open circular area exceed 10 microns, the prior art process can regulate the thicknesses of the quantum wells to a target value. For this reason, the present invention is desirable for an open stripe area and an open circular area equal to or less than 10 microns. Another parameter may be controlled so as to keep the amount of compound semiconductor to be deposited on unit area constant. For example, both of the depositing time and the gas flow rate may be controlled.

What is claimed is:

1. A process of fabricating a multiple compound semiconductor structure changing the area of a surface during a growth of compound semiconductor, comprising the steps of:
   a) preparing a substrate;
   b) forming a mask defining an open area of said substrate; and
   c) epitaxially growing said compound semiconductor on said open area by changing at least one parameter of the epitaxial growth so as to control the amount of said compound semiconductor to be deposited per unit area of said surface, wherein said at least one parameter is a time for depositing said compound semiconductor so as to form each component layer of said multiple compound semiconductor structure, and said time is decreased from the bottom component layer of said multiple compound semiconductor structure closest to said substrate toward the top component layer of said multiple compound semiconductor structure spaced from said substrate.

2. The process as set forth in claim 1, in which said multiple compound semiconductor structure is a multiple quantum well structure.

3. The process as set forth in claim 1, wherein said substrate is formed of indium phosphide, and metalorganic compounds selectively used for the growth of said compound semiconductor contain gallium, indium, aluminum, arsenic, phosphorous or nitrogen, respectively.

4. The process as set forth in claim 1, wherein said open area has a width equal to or less than 10 microns.

5. The process as set forth in claim 1, wherein, said open area has a diameter equal to or less than 10 microns.

6. The process as set forth in claim 1, wherein said at least one parameter also comprises a gas flow rate for depositing each component layer of said multiple compound semiconductor structure.

7. The process as set forth in claim 6, wherein said gas flow rate is decreased from the bottom component layer of said multiple compound semiconductor structure closest to said substrate toward the top component layer of said multiple compound semiconductor structure spaced from said substrate.

8. A process of fabricating a multiple compound semiconductor structure changing the area of a surface during a growth of compound semiconductor, comprising the steps of:
   a) preparing a substrate;
   b) forming a mask defining an open area of said substrate, said open area having a diameter equal to or less than 10 microns; and
   c) metalorganic vapor phase epitaxially growing said compound semiconductor on said open area by changing at least one parameter of the epitaxial growth so as to control the amount of said compound semiconductor to be deposited per unit area of said surface, wherein said at least one parameter is a time for depositing said compound semiconductor so as to form each component layer of said multiple compound semiconductor structure, and in which said time is decreased from the bottom component layer of said multiple compound semiconductor structure closest to said substrate toward the top component layer of said multiple compound semiconductor structure spaced from said substrate.

9. The process as set forth in claim 8, wherein said multiple compound semiconductor structure comprises a multiple quantum well structure.

10. The process as set forth in claim 8, wherein said substrate is formed of indium phosphide, and metalorganic compounds selectively used for said metalorganic vapor phase growth contain gallium, indium, aluminum, arsenic, phosphorous or nitrogen, respectively.

11. The process as set forth in claim 8, and further comprising changing a second parameter comprising a gas flow rate for depositing each component layer of said multiple compound semiconductor structure.

12. The process as set forth in claim 11, wherein said gas flow rate is decreased from the bottom component layer of said multiple compound semiconductor structure closest to said substrate toward the top component layer of said multiple compound semiconductor structure spaced from said substrate.

13. A process of fabricating a multiple compound semiconductor structure changing the area of a surface during a growth of compound semiconductor, comprising the steps of:
   a) preparing a substrate;
   b) forming a mask defining an open area of said substrate; and c) epitaxially growing said compound semiconductor on said open area by changing at least one parameter of the epitaxial growth so as to control the amount of said compound semiconductor to be deposited per unit area of said surface, wherein said at least one parameter is a gas flow rate for depositing each component layer of said multiple compound semiconductor structure, and said gas flow rate is decreased from the bottom component layer of said multiple compound semiconductor structure closest to said substrate toward the top component layer of said multiple compound semiconductor structure spaced from said substrate.

14. The process as set forth in claim 13, wherein said multiple compound semiconductor structure comprises a multiple quantum well structure.

15. The process as set forth in claim 13, wherein a metalorganic vapor phase epitaxy is used in said step c).

16. The process as set forth in claim 15, wherein said at least one parameter also comprises a time for depositing said compound semiconductor so as to form each component layer of said multiple compound semiconductor structure.

17. The process as set forth in claim 16, wherein said time is decreased form the bottom component layer of said multiple compound semiconductor structure closest to said substrate toward the top component layer of said multiple compound semiconductor structure spaced from said substrate.

18. The process as set forth in claim 15, wherein said substrate is formed of indium phosphide, and metalorganic compounds selectively used for the growth of said compound semiconductor contain gallium, indium, aluminum, arsenic, phosphorous or nitrogen, respectively.

19. The process as set forth in claim 13, wherein said open area has a width equal to or less than 10 microns.

20. The process as set forth in claim 13, wherein said open area has a diameter equal to or less than 10 microns.

21. A process of fabricating a multiple compound semiconductor structure changing the area of a surface during a growth of compound semiconductor, comprising the steps of:

a) preparing a substrate;
b) forming a mask defining an open area of said substrate, said open area having a diameter equal to or less than 10 microns; and
c) epitaxially growing said compound semiconductor on said open area by changing at least one parameter of the epitaxial growth so as to control the amount of said compound semiconductor to be deposited per unit area of said surface, wherein said at least one parameter is a gas flow rate for depositing each component layer of said multiple compound semiconductor structure, and said gas flow rate is decreased from the bottom component layer of said multiple compound semiconductor structure closest to said substrate toward the top component layer of said multiple compound semiconductor structure spaced from said substrate.

22. The process as set forth in claim 21, wherein said multiple compound semiconductor structure comprises a multiple quantum well structure.

23. The process as set forth in claim 21, wherein a metalorganic vapor phase epitaxy is used in said step c).

24. The process as set forth in claim 23, and further comprising changing a second parameter comprising a time for depositing said compound semiconductor to form each component layer of said multiple compound semiconductor structure.

25. The process as set forth in claim 23, wherein said substrate is formed of indium phosphide, and metalorganic compounds selectively used for the growth of said compound semiconductor contain gallium, indium, aluminum, arsenic, phosphorous or nitrogen, respectively.

* * * * *